(12) United States Patent
Zlotnik et al.

(10) Patent No.: US 11,741,024 B2
(45) Date of Patent: Aug. 29, 2023

(54) CLOCK CROSSING FIFO STATUS CONVERGED SYNCHRONIZER

(71) Applicant: Intel Corporation, Santa Clara, CA (US)

(72) Inventors: Leon Zlotnik, Camino, CA (US); Jeremy Anderson, Hillsboro, OR (US); Lev Zlotnik, Holon (IL); Daniel Ballegeer, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 262 days.

(21) Appl. No.: 16/995,638

(22) Filed: Aug. 17, 2020

(65) Prior Publication Data

US 2021/0157750 A1 May 27, 2021

Related U.S. Application Data

(60) Provisional application No. 62/940,729, filed on Nov. 26, 2019.

(51) Int. Cl.
*G06F 13/16* (2006.01)
*H03K 3/037* (2006.01)
*H03K 23/54* (2006.01)
*H03K 19/20* (2006.01)
*H03K 23/00* (2006.01)

(52) U.S. Cl.
CPC ...... *G06F 13/1605* (2013.01); *G06F 13/1668* (2013.01); *H03K 3/0377* (2013.01); *H03K 19/20* (2013.01); *H03K 23/005* (2013.01); *H03K 23/542* (2013.01)

(58) Field of Classification Search
None
See application file for complete search history.

(56) References Cited

U.S. PATENT DOCUMENTS 6,542,987 B1 * 4/2003 Fischer .................. G06F 9/384
714/21

\* cited by examiner

*Primary Examiner* — Scott C Sun
(74) *Attorney, Agent, or Firm* — Nicholson De Vos Webster & Elliott LLP

(57) ABSTRACT

A synchronizer that can generate pipeline (e.g., FIFO, LIFO) status in a single step without intermediate synchronization. The status can be an indicator of whether a pipeline is full, empty, almost full, or almost empty. The synchronizer (also referred to as a double-sync or ripple-based pipeline status synchronizer) can be used with any kind of clock crossing pipeline and all kinds of pointer encodings. The double-sync and ripple-based pipeline status synchronizers eliminate costly validation and semi-manual timing closure, suggests better performance and testability, and have lower area and power.

20 Claims, 15 Drawing Sheets

CLOCK CROSSING FIFO STATUS CONVERGED SYNCHRONIZER

CLAIM OF PRIORITY

This application claims priority from U.S. Provisional Patent Application Ser. No. 62/940,729 titled "Clock Crossing FIFO Status Converged Synchronizer" filed Nov. 26, 2019, which is incorporated by reference in its entirety.

BACKGROUND

Currently, a clock-crossing First-in-First-out (FIFO) cannot efficiently generate converged full, empty, almost full, and/or almost empty status of a FIFO directly.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
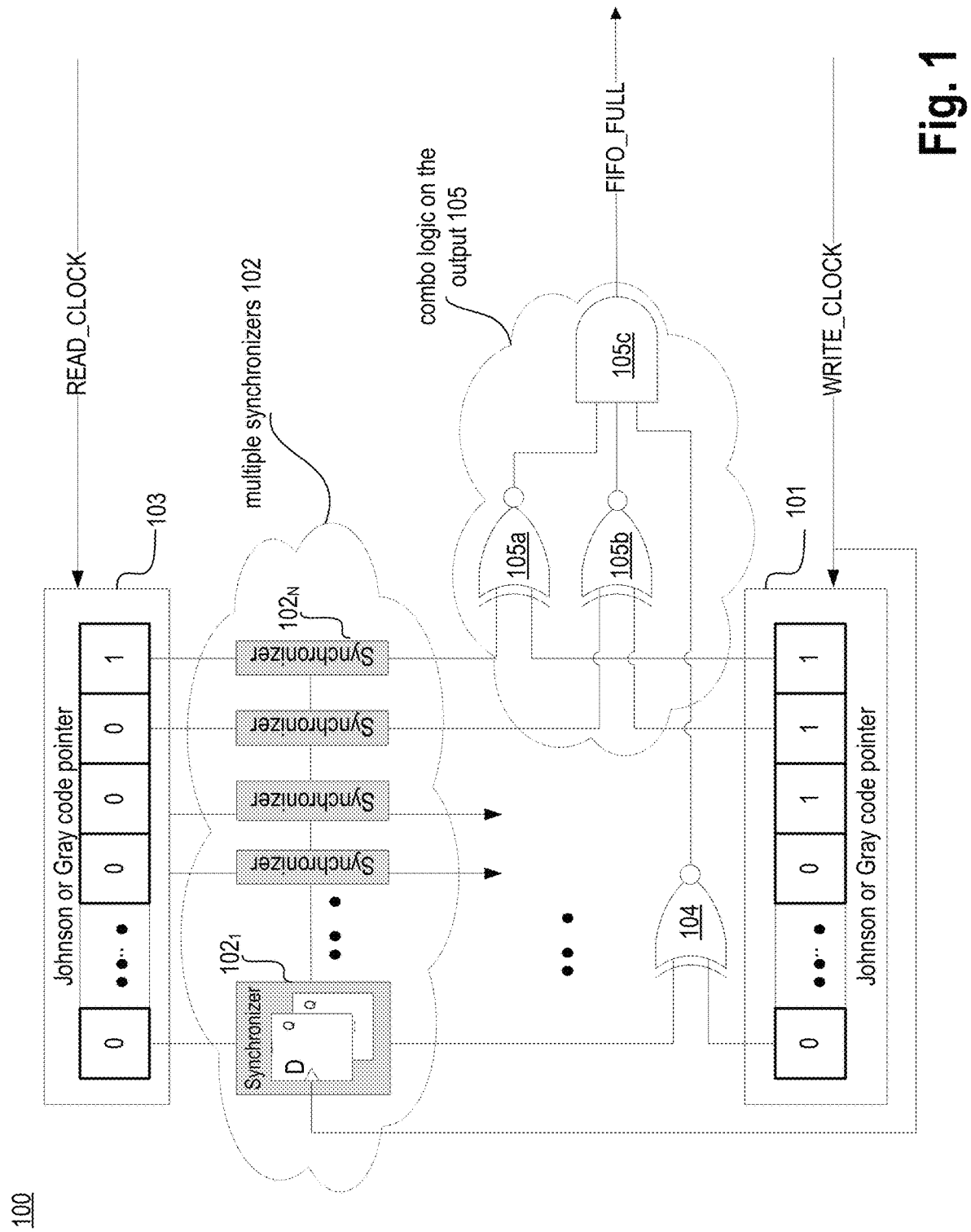
FIG. 1 illustrates a first-in-first-out (FIFO) status generator.

One method to generate converged full/empty status of a clock-crossing first-in-first-out (FIFO) directly is to use either Gray, Johnson ring, or other codes with per-bit synchronizers. In this case, a read pointer is synchronized to the write clock domain and then compared with the write pointer in the write clock domain to generate a "Full" status, and a write pointer is synchronized to the read clock domain and then compared with the read pointer in the read clock domain to generate an "Empty" status. To guarantee code coherency, each synchronized bit propagation time is limited (usually done by delay control semi-manually). However, this method is insufficient to overcome the issue of generating converged full/empty status of a clock-crossing FIFO directly.

For example, this method generates FIFO status using a high number of synchronizers that waste area and power (both leakage and dynamic). The number of synchronizers required using Johnson ring codes for the FIFO is at least two times the FIFO depth. Johnson ring codes for the FIFO are usually seen in shallow, non-power-of-two FIFOs. Johnson FIFOs may be significantly faster, with the tradeoff of higher power and larger area.

Using Gray code for the FIFO requires two times log 2(FIFO depth) synchronizers. However, using Gray code for the FIFO for other depths may be very challenging.

Whether Johnson, Gray, or other code, the FIFO status in this method is not directly driven by a flip-flop and has combinational logic, which sets limitations on performance and intellectual property (IP) integration. Constraining appropriate source-destination pairs for maximum delay timing to guarantee synchronized code coherency is a challenge. Furthermore, multiple asynchronous source-destination paths are typically not covered well by at-speed scan, which increases the risk of bad silicon escapes to a customer. As such, the method to generate full and/or empty status of a clock-crossing FIFO using either Gray Johnson ring, or similar codes with per-bit synchronizers suffers from many challenges.

Some embodiments describe a synchronizer that can generate a FIFO status in a single step without intermediate synchronization. The status can be an indicator of whether a FIFO is full, empty, almost full, or almost empty. The synchronizer (also referred to as a double-sync or ripple-based FIFO status synchronizer) can be used with any kind of clock crossing FIFO and all kinds of pointer encodings, in accordance with some embodiments. The FIFO status synchronizer of various embodiments addresses known limitations of both kinds of FIFO. It also applies to other codes that may be used for FIFO pointers.

In some embodiments, the synchronizer comprises: a FIFO; first set of pointers associated with the FIFO, wherein the first set of pointers are associated with a read clock used to read from the FIFO; and a second set of pointers associated with the FIFO, wherein the second set of pointers are associated with a write clock used to write to the FIFO. In some embodiments, the synchronizer comprises comparators (e.g., XNOR gates) to compare the first set of pointers with the second set of pointers. In some embodiments, the synchronizer comprises an AND logic coupled to outputs of the comparators. In some embodiments, a filter (e.g., an RC filter) is coupled to an output of the AND logic. In some embodiments, a Schmitt trigger is coupled to the filter. In some embodiments, the synchronizer comprises at least two flip-flops coupled to the Schmitt trigger, wherein an output of one of the at least two flip-flops indicate a status of the FIFO. In some embodiments, an output of the Schmitt trigger is to set or reset outputs of the at least two flip-flops. In some embodiments, clock terminals of the at least two flip-flops are coupled to the read clock to indicate an empty status of the FIFO. In some embodiments, clock terminals of the at least two flip-flops are coupled to the write clock to indicate a full status of the FIFO. In some embodiments, the first and second set of pointers are Johnson coded pointers.

In some embodiments, the first and second set of pointers are Gray coded pointers. In some embodiments, an input of the first flip-flop of the at least two flip-flops is coupled to ground or power supply, and wherein an output of the first flip-flop of the at least two flip-flops is coupled to an input of the second flip-flop of the at least two flip-flops.

There are many technical effects of the various embodiments. For example, both the double-sync and ripple-based FIFO status synchronizers of some embodiments eliminate costly validation and semi-manual timing closure, suggest better performance and testability, and have lower area and power. In one instance, either the double-sync or ripple-based FIFO status synchronizer are faster, e.g., 20% to 35% faster than the clock-crossing FIFO that uses either Gray or Johnson ring codes. The double-sync or ripple-based FIFO status synchronizer uses lower area, e.g., 30% to 65% lower area than the clock-crossing FIFO that uses either Gray or Johnson ring codes. The double-sync or ripple-based FIFO status synchronizer results in power savings, e.g., 23% to 68% power savings. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g, immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front." "back," "top." "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a first-in-first-out (FIFO) status generator 100. This FIFO status generator 100 consists of two Johnson or Gray code sequential units 101 and 103; multiple synchronizers 102 with per-bit synchronizers $102_{1-N}$; XNOR (exclusive-OR) gate 104, and output combinational (combo) logic 105 coupled as shown. Write clock and Read clock are provided to the two Johnson or Gray code sequential units 101 and 103, respectively, as shown. This FIFO status generator 100 has many drawbacks. For example, FIFO status generator 100 of FIG. 1 requires multiple synchronizers—one per pointer bit. FIFO status generator 100 of FIG. 1 consumes a lot of area, leakage, and dynamic power as those synchronizers $102_{1-N}$ are always clocked.

The FIFO status (FIFO_FULL) is driven by a big cone of combinatorial logic 105. Combinatorial logic 105 comprises XNOR gates 105a, 105b, and many others (e.g., N number of gates) that compare outputs of individual synchronizers and Johnson or Gray code sequential units 101. The output of XNOR 104 and other XNOR gates 105a, 105b, etc. are ANDed by AND gate 105c to generate the FIFO status FIFO_FULL. This reduces overall performance and limits FIFO integration, especially when the FIFO is involved in cross-IP (cross intellectual property) traffic. Though testing an asynchronous path towards synchronizer is possible, it is usually done using static (stuck-at) scan. The more synchronizers that are present, the higher risk of an at speed defect to escape into customer silicon based processor.

A synchronizer's mean time between failures (MTBF) is not infinite for FIFO status generator 100 of FIG. 1. The more synchronizers, the less an overall product MTBF. The code coherency for FIFO status generator 100 of FIG. 1 requires all paths to synchronizers to meet a maximum (max) delay timing of 1 clock (with extra margin for clock tree skew, crosstalk, etc.). This is usually done semi-manually and requires significant effort. The procedure for generating a status indicator using FIFO status generator 100 of FIG. 1 is not robust and prone to bugs. For instance, multiple synchronizers require more work and bear more risk.

Figure 2A:
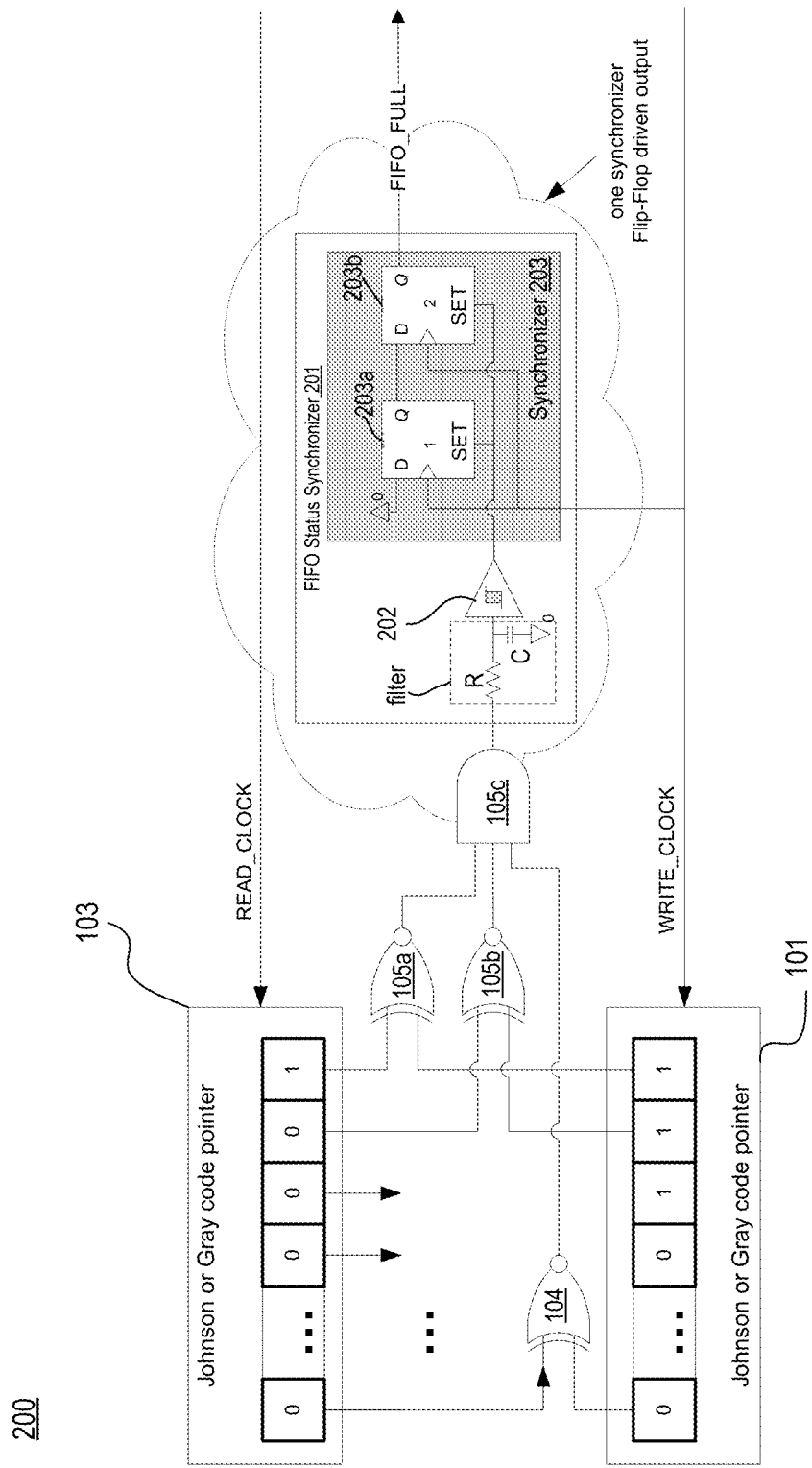
FIG. 2A illustrates an apparatus for FIFO full status generation, in accordance with some embodiments.

FIG. 2A illustrates apparatus 200 (also referred here as FIFO or pipeline status generator 200) for FIFO or pipeline full status generation, in accordance with some embodiments. FIFO status generator 200 comprises two Johnson or Gray code pointers (or registers holding pointers) 101 and 103; comparison logic (e.g., XNOR gates 104, 105a, 105b, etc.); AND gate 105c (to receive outputs of all XNORs), and FIFO status synchronizer 201. FIFO status synchronizer 201 comprises filter, Schmitt Trigger 202, and flip-flops 1 and 2 (203a and 203b, respectively) coupled as shown. The filter is illustrated as an RC filter, and assist with the response in that any noise is suppressed. In some embodiments, another type of filter may be used. In some embodiments, the filter is removed. Here, Schmitt trigger 202 and the filter are at the inputs of flip-flops, 203a and 203b and the output of Schmitt trigger 202 is used to set or reset flip-flops 203a and 203b. The input of flip-flop 203a is tied to a constant value (e.g., ground or 0 V) while the output of flip-flop 203a is received as data input of flip-flop 203b. To determine whether the FIFO is full, flip-flops 203a and 203b are clocked by the WRITE_CLOCK. The XNOR gates (e.g., 104, 105a, 105b, etc.) are comparators that compare two inputs. XNOR gates can be replaced with any suitable comparison circuitry (or comparator) such as a XOR gate. A person skilled in the art would appreciate that the combinational logic can be optimized or modified using De Morgan's Theorem. Such modifications are within the scope of the various embodiments.

FIFO Status Synchronizer 201 of FIG. 2A converges the status directly from two pointers—pointer associated with the READ_CLOCK and pointer associated with the WRITE_CLOCK. In this case, no other synchronizers are used, regardless of the pointer width, in accordance with some embodiments. In some embodiments, apparatus 200 for FIFO status generation uses standard two-stage (double-sync) or multiple-stage synchronizer and Schmidt Trigger cells.

Figure 2B:
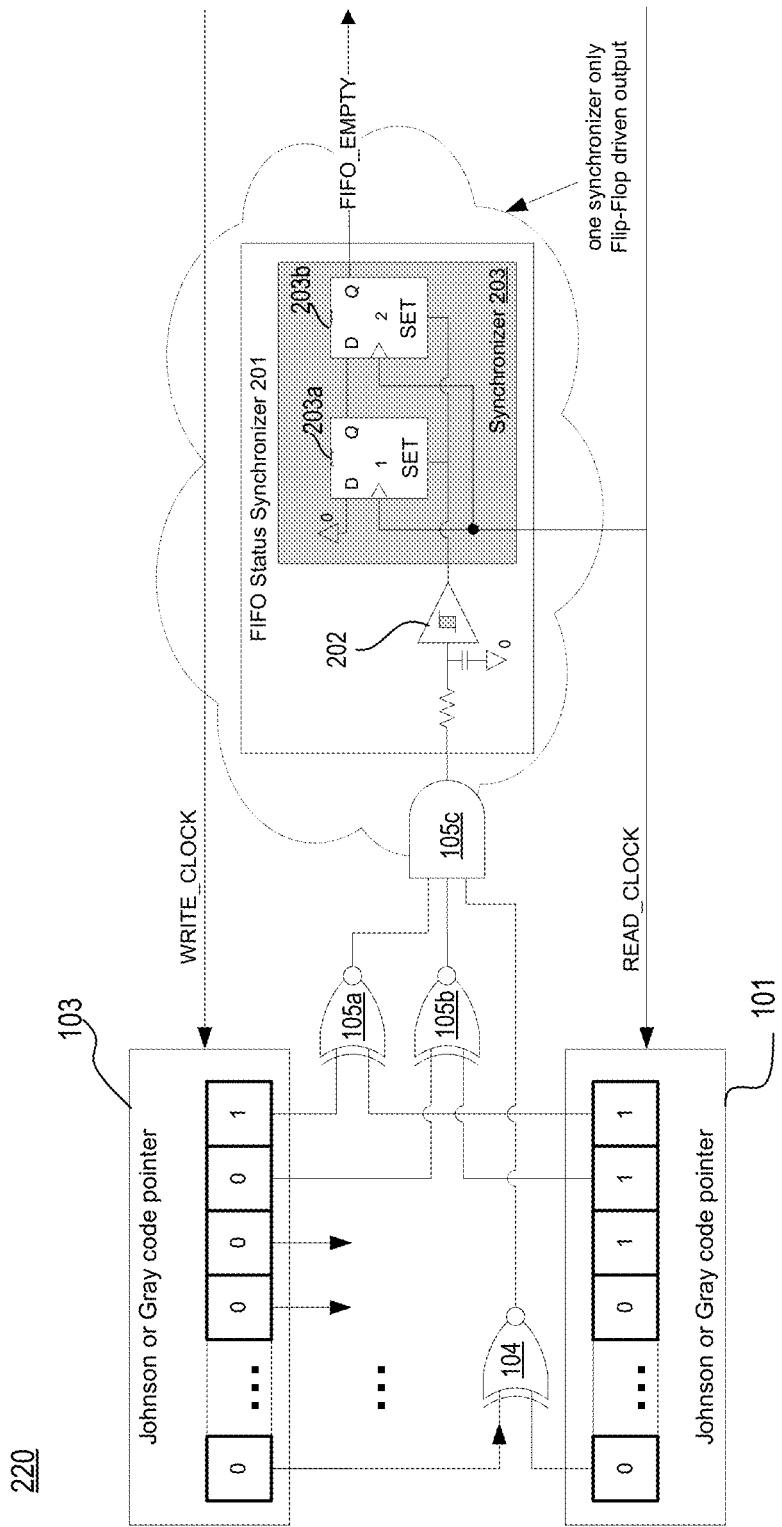
FIG. 2B illustrates an apparatus for FIFO empty status generation, in accordance with some embodiments.

Synchronizer 203 of FIG. 2A takes advantage of the fact that the assertion of the full and empty signals is not a cross-clock event, but is synchronous to the write and read clock domains, respectively. The full signal is asserted when the write pointer catches up to the read pointer. The write pointer increments on the write clock, and the full indication is used in the write clock domain to gate increments of the write pointer. Similarly, the empty signal is asserted when the read pointer catches up to the write pointer and is used in the read clock domain to gate the read data and the increment of the read pointer, as shown in FIG. 2B.

Referring back to FIG. 2A, de-assertion of full and/or empty is the cross-clock event. When the other pointer pulls away, these signals de-assert. As with any de-assertion into an asynchronous reset/set pin on a sequential cell, this edge may have a metastability risk and so synchronization is used. A standard set synchronizer that allows the assertion to propagate immediately through an asynchronous set pin but synchronizes the de-assertion covers this hazard. The assertion arc is covered with appropriate timing closure through the asynchronous set pin.

Since the de-assertion does not have a timing relationship to the assertion, the circuit of FIG. 2A may also have a metastability risk separate from the normal setup/hold timing violation. Normally, metastability in a sequential cell occurs when the data input is changing during the cell's setup/hold or reset/set input is changing within the recovery/removal window while the clock is turning off the pass gate to the state node. The state node does not reach the rail and goes metastable. In this circuit, if the assertion and de-assertion of set come close enough in time together that the asynchronous set/reset pin does not have time to pull the state node to the rail, this synchronizer may go metastable outside of the recovery/removal window.

To mitigate this risk of metastability, Schmitt trigger 202 is added before the SET pin of synchronizer 203, in accordance with various embodiments. In some embodiments, Schmitt trigger 202 functions as a time filter for the input signal into the asynchronous SET pin(s) of flip-flops 203a and 203b of synchronizer 203 to remove the possibility that a short pulse will send the flip-flops metastable. It adds enough hysteresis between assertion and de-assertion to eliminate this metastability risk.

FIG. 2B illustrates apparatus 220 for FIFO empty status generation, in accordance with some embodiments. Compared to FIG. 2A, here the read clock (READ_CLOCK) is used to sample the FIFO flip-flops 1 and 2 (203a and 203b, respectively). As such, the output (FIFO_EMPTY) of the FIFO status synchronizer indicates whether the FIFO is empty. The size of the synchronizers of FIGS. 2A-B is roughly equal to one synchronizer of FIG. 1 because the area of Schmidt Trigger 202 is very small. For example, Schmidt Trigger 202 adds only about 6 to 8 extra transistors.

While the embodiments here disclose two flip-flops for the FIFO status synchronizer, any number of flip-flops may be used in cascaded form if higher MTBF is desired. Flip-flops 203a and 203b (and flip-flops of other embodiments) may be replaced with any suitable sequential unit which is capable of sampling data, clearing or setting its output, etc. Flip-flops 203a and 203b (and flip-flops of other embodiments) may also include a scan gadget (not shown) with relevant scan control and scan input for testing the operating of the synchronizer. While various embodiments are described with reference to points 101 and 103 for a FIFO, the FIFO can be any suitable pipeline (e.g., a series of registers). In one example, the FIFO can be replaced with a last-in-first-out (LIFO) pipeline. The embodiments can be extended to other types of pipelines too.

Figure 3:
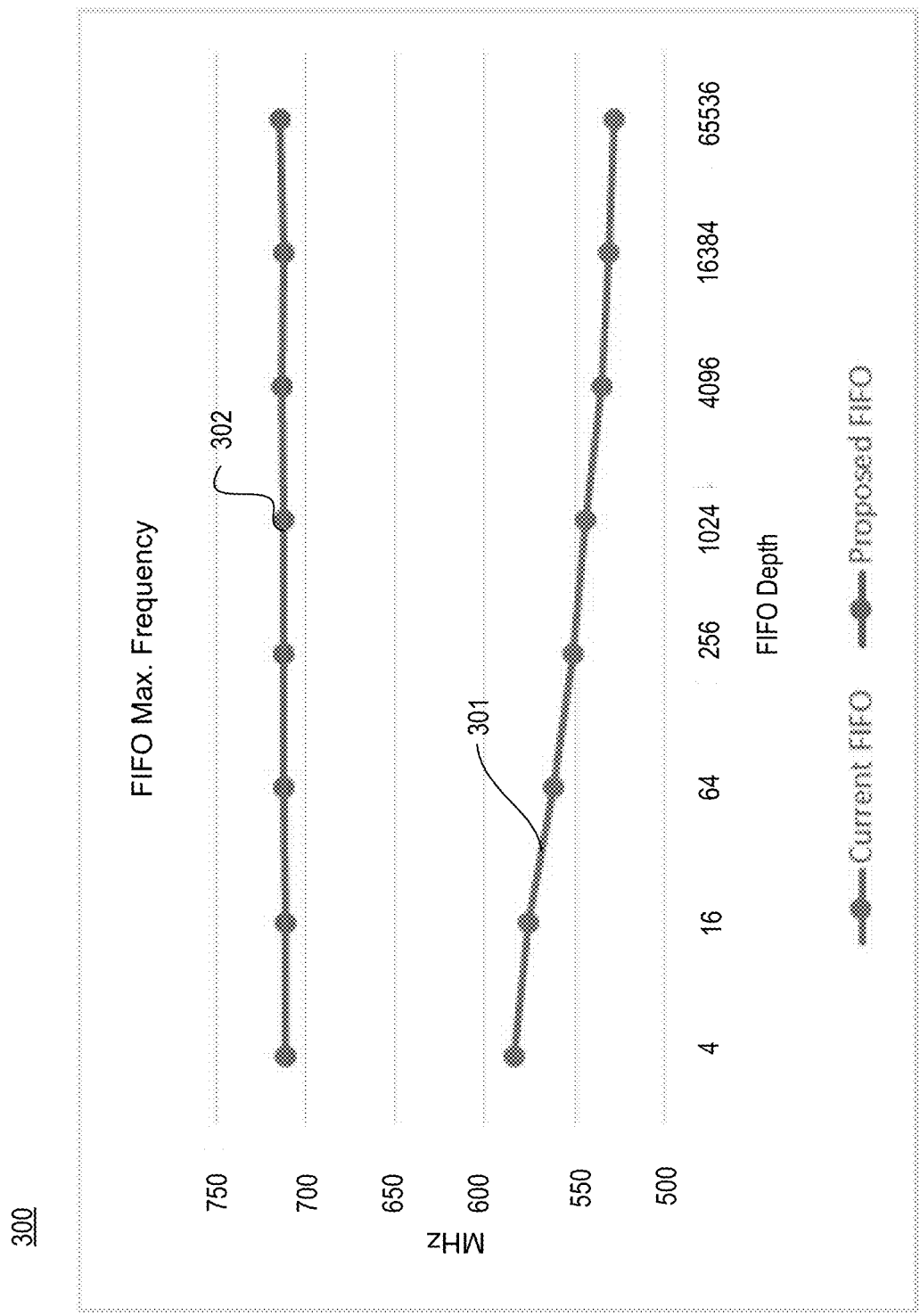
FIG. 3 illustrates a plot showing performance comparison, in accordance with some embodiments.

FIG. 3 illustrates plot 300 showing performance comparison, in accordance with some embodiments. The synthesized frequency attained with both the FIFO design of FIG. 1 (set of points 301) and one using the embodiment of FIG. 2A (set of points 302) are shown. In this example, the FIFO of FIG. 2A has a 20% frequency advantage even at lower FIFO depths, and that advantage increases to 35% at higher depths compared to the FIFO of FIG. 1.

Figure 4:
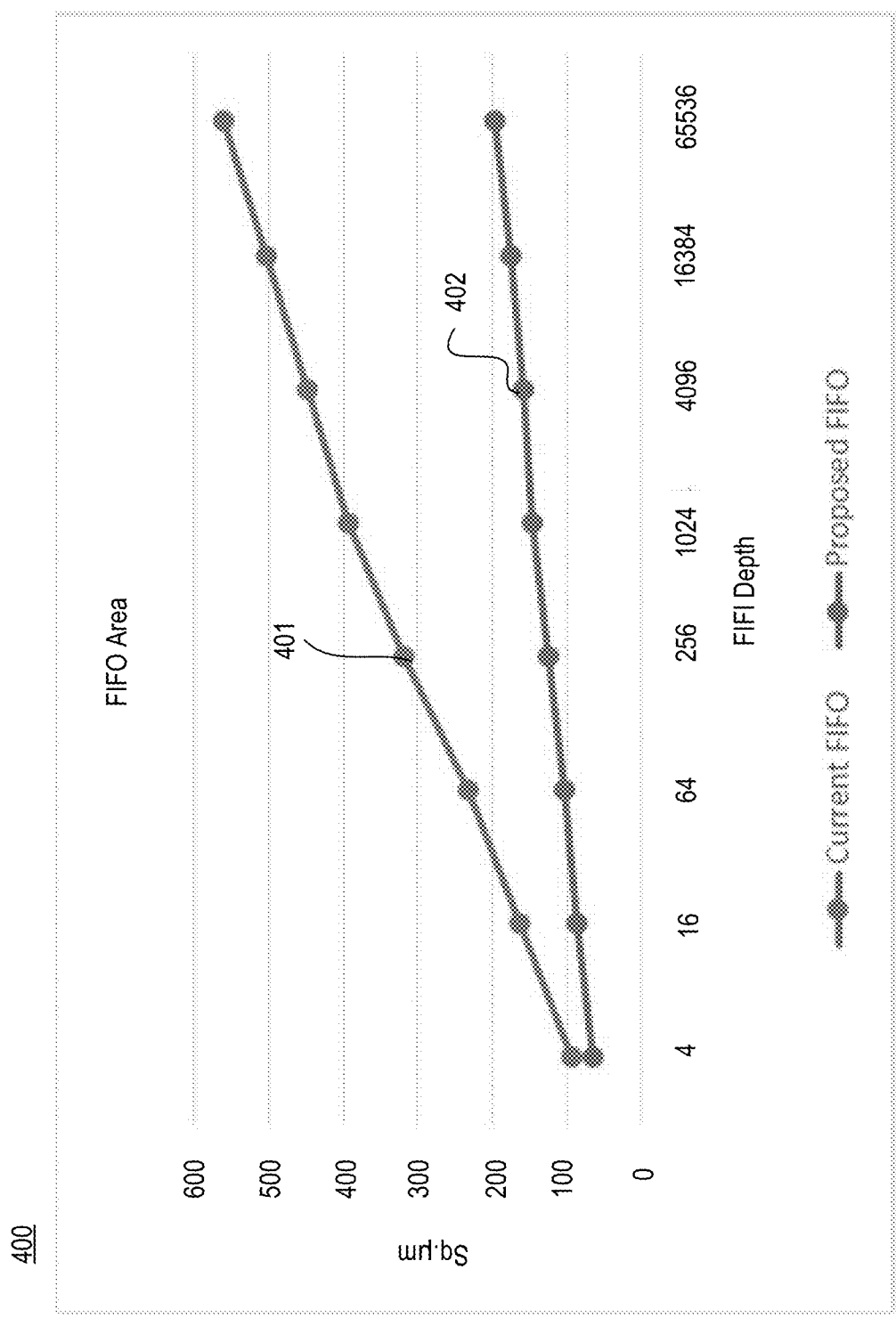
FIG. 4 illustrates a plot showing area comparison, in accordance with some embodiments.
Figure 5:
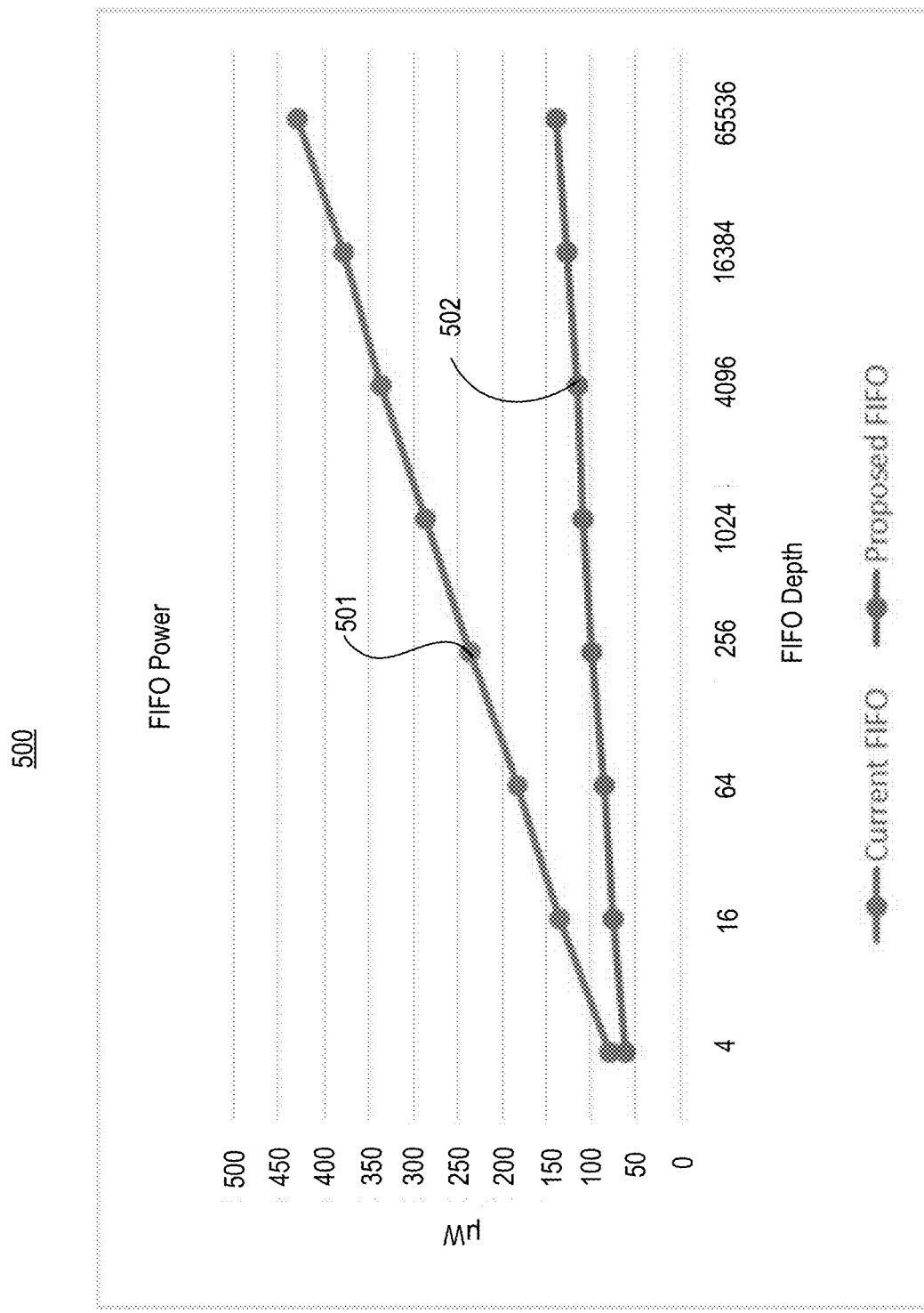
FIG. 5 illustrates a plot showing power comparison, in accordance with some embodiments.

FIG. 4 illustrates plot 400 showing area comparison, in accordance with some embodiments. The FIFO area attained with both the FIFO design of FIG. 1 (set of points 401) and one using the embodiment of FIG. 2A (set of points 402) are shown. The area of the embodiment of FIG. 2A is much smaller than the area of FIFO design of FIG. 1, especially when FIFO depth increases. FIG. 5 illustrates plot 500 showing power comparison, in accordance with some embodiments. The FIFO power attained with both the FIFO design of FIG. 1 (set of points 501) and one using the embodiment of FIG. 2A (set of points 502) are shown. The power of the embodiment of FIG. 2A is much smaller than the power of FIFO design of FIG. 1, especially when FIFO depth increases.

As the FIFO depth increases, the number of synchronizers needed for the full/empty indications increases with the design of FIG. 1, but stays fixed for the design of various embodiments. This has a direct impact on power and area as shown in FIG. 4 and FIG. 5. The FIFO synchronizer of various embodiments results in significant savings per FIFO, especially as FIFO depth increases. The FIFO synchronizer of various embodiments (e.g., FIGS. 2A-B) saves 23% of power at the low end, and 68% at the high end of the graph. Area savings tracks closely at 30% to 65%. For higher frequency FIFOs using low VT (threshold) transistors, the advantage of the new design is more pronounced.

In some chips, there may be as many as, for example, 500 asynchronous FIFOs. Assuming a 14 nm process technology node, at an average depth of 64, using design of FIG. 2A saves about 50 mW of power and 65,000 square microns. Design trends for system-on-chips (SoCs) are to move more clock crossings to fully asynchronous crossings for higher performance while also increasing the number of asynchronous clock domains in order to save power.

The FIFO synchronizer of various embodiments solves all known limitations of the clock crossing FIFO status generation. Each status uses one synchronizer, regardless of the code or FIFO depth. This saves a lot of area, leakage and dynamic power and allows best MTBF and at-speed scan. The FIFO status is driven by a flip-flop. This guarantees best performance and cross-IP Integration. The code coherency is easy to achieve as all pointer bits converge into the single synchronizer. The metastability hazard from de-assertion is fully covered by a single standard cell synchronizer coupled with a Schmitt trigger.

Figure 6A:
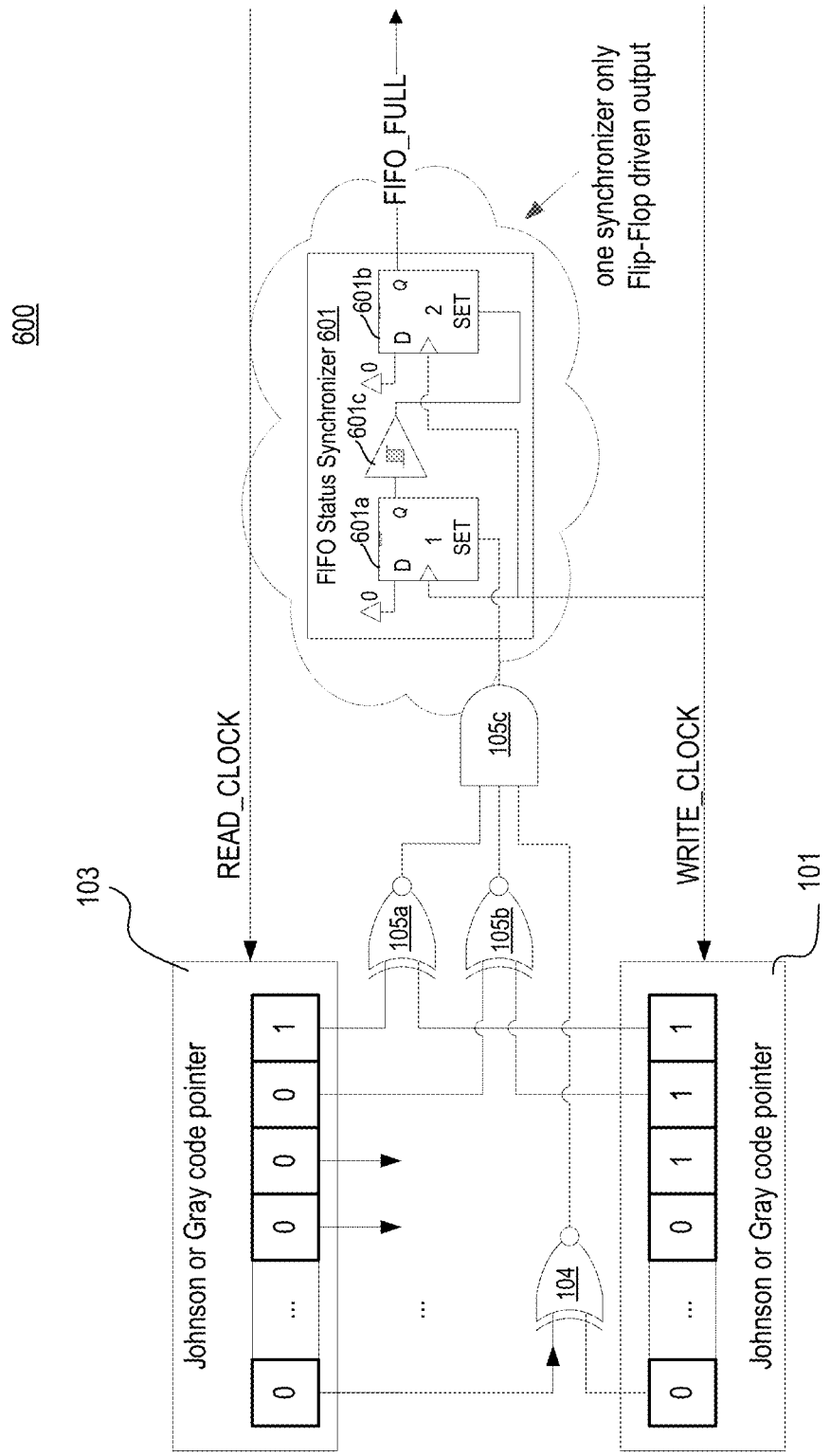
FIG. 6A illustrates an apparatus for FIFO full status generation, in accordance with some embodiments.

FIG. 6A illustrates a FIFO full status synchronizer 600 (ripple-based FIFO full status synchronizer), in accordance with some embodiments. FIFO status synchronizer 600 comprises two Johnson or Gray code pointers (or registers holding pointers) 101 and 103; comparison logic (e.g., XNOR gates 104, 105a, 105b, etc.); AND gate 105c (to receive outputs of all XNORs), and FIFO status synchronizer 601. FIFO status synchronizer 601 comprises flip-flops 1 and 2 (601a and 601b, respectively) and Schmitt Trigger 601c coupled as shown. Here, the output of AND gate 105c is used to set or reset flip-flop 601a. The data inputs of flip-flop 601a and flip-flop 601b are tied to a constant value (e.g., ground or 0 V) while the output of flip-flop 601a is received as input of Schmitt Trigger 601c. The output of Schmitt Trigger 601c is used to set or reset flip-flop 601b. To determine whether the FIFO is full, flip-flops 601a and 601b are clocked by the WRITE_CLOCK.

Synchronizer 600 of FIG. 6A takes advantage of the fact that the assertion of the full/empty signal is not a cross-clock event, but is synchronous to the write/read clock domain respectively. The full signal is asserted when the write pointer catches up to the read pointer. The write pointer increments on the write clock, and the full indication is needed in the write clock domain to gate increments of the write pointer. Similarly, the empty signal is asserted when the read pointer catches up to the write pointer and is needed in the read clock domain to gate the read data and the increment of the read pointer, as shown in FIG. 6B.

Referring back to FIG. 6A, the de-assertion of full/empty is a cross-clock event. When the other pointer pulls away, these signals de-assert. As with any de-assertion into an asynchronous SET pin on a sequential, this edge has a metastability risk and needs synchronization. A synchronizer that allows the assertion to propagate immediately through an asynchronous set pin, but synchronizes the de-assertion covers this hazard. The assertion arc is covered with appropriate timing closure through the asynchronous set pin.

Since the de-assertion does not have a timing relationship to the assertion, circuit 600 of FIG. 6A also has a metastability risk separate from the normal setup/hold violation. Normally, metastability in a sequential cell occurs when the data input is changing during the cell's setup/hold window, or reset/set input is changing during the recovery/removal window while the clock is turning off the pass-gate to the state node. The state node does not reach the rail and goes metastable. In this circuit if the assertion and de-assertion come close enough together that the asynchronous set/reset pin does not have time to pull the state node to the rail, this synchronizer will go metastable regardless whether the change to the set/reset signal happens within the recovery/removal window. In this circuit, both sources of metastability are mitigated by the addition of Schmitt trigger 601c between the synchronizer flops 601a and 601b. Schmitt trigger 601c filters a metastable value caused by either condition described above of first flip-flop 601a from propagating to second flip-flop 601b of synchronizer 601 while the state node of the first flip-flop 601a recovers to a stable value. Here, the output (FIFO_FULL) of FIFO status synchronizer 601 indicates wither the FIFO is full.

Figure 6B:
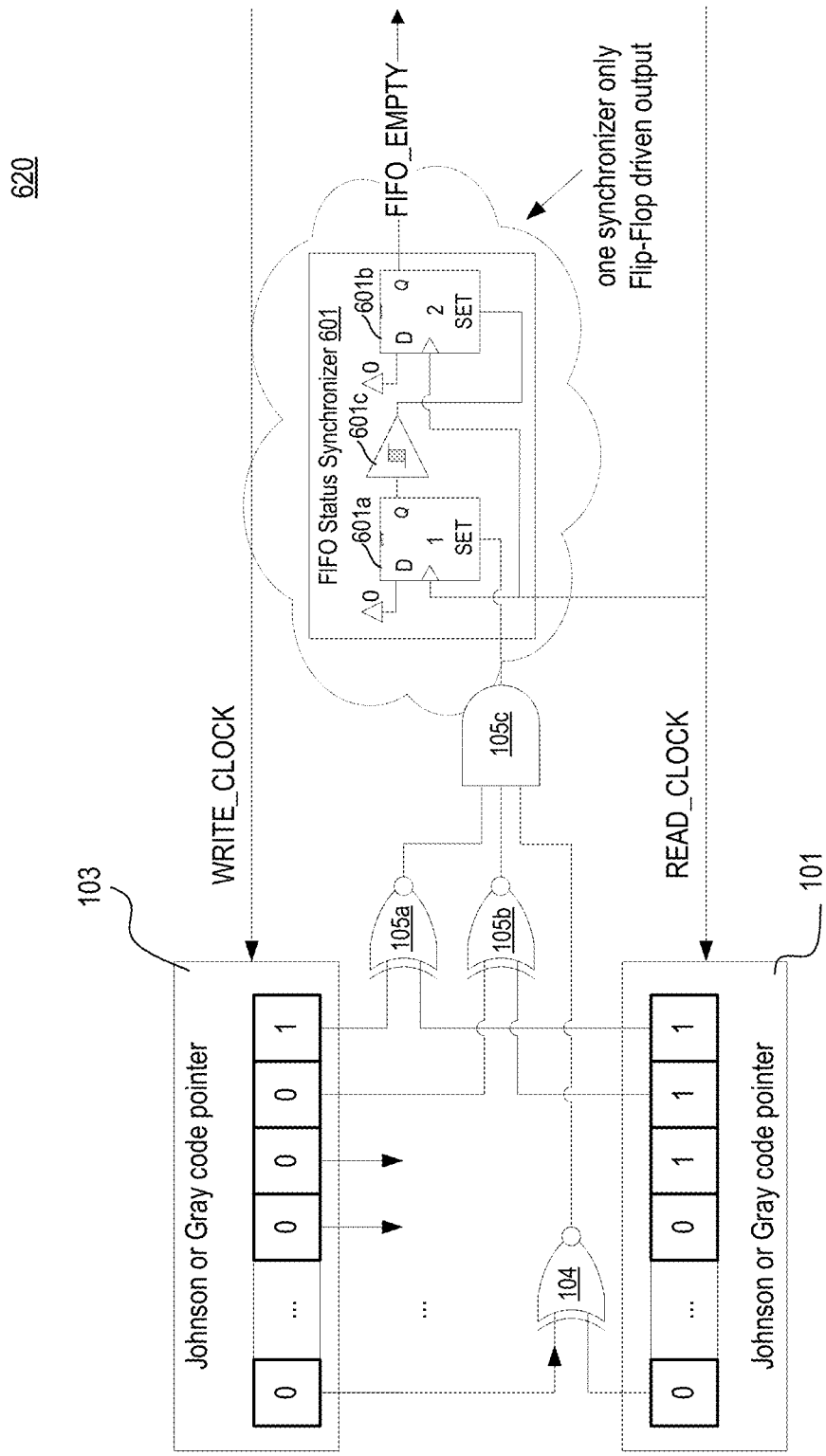
FIG. 6B illustrates an apparatus for FIFO empty status generation, in accordance with some embodiments.

FIG. 6B illustrates an apparatus FIFO empty status synchronizer 620 (ripple-based FIFO empty status synchronizer), in accordance with some embodiments. Compared to FIG. 6A, here the read clock (READ_CLOCK) is used to sample FIFO flip-flops 601a and 601b. As such, the output (FIFO_EMPTY) of the FIFO status synchronizer 601 indicates whether the FIFO is empty. The size of the synchronizers of FIGS. 6A-B is roughly equal to synchronizer of FIG. 2A because the area of Schmidt Trigger 601c is very small. For example, the impact of Schmidt Trigger 601c adds only about 6 to 8 extra transistors. While the embodiments here disclose two flip-flops for the FIFO status synchronizer, any number of flip-flops may be used in cascade form if higher MTBF is desired. The performance advantages illustrated with reference to FIGS. 3-5 are applicable for the synchronizer of FIGS. 6A-B.

Figure 7:
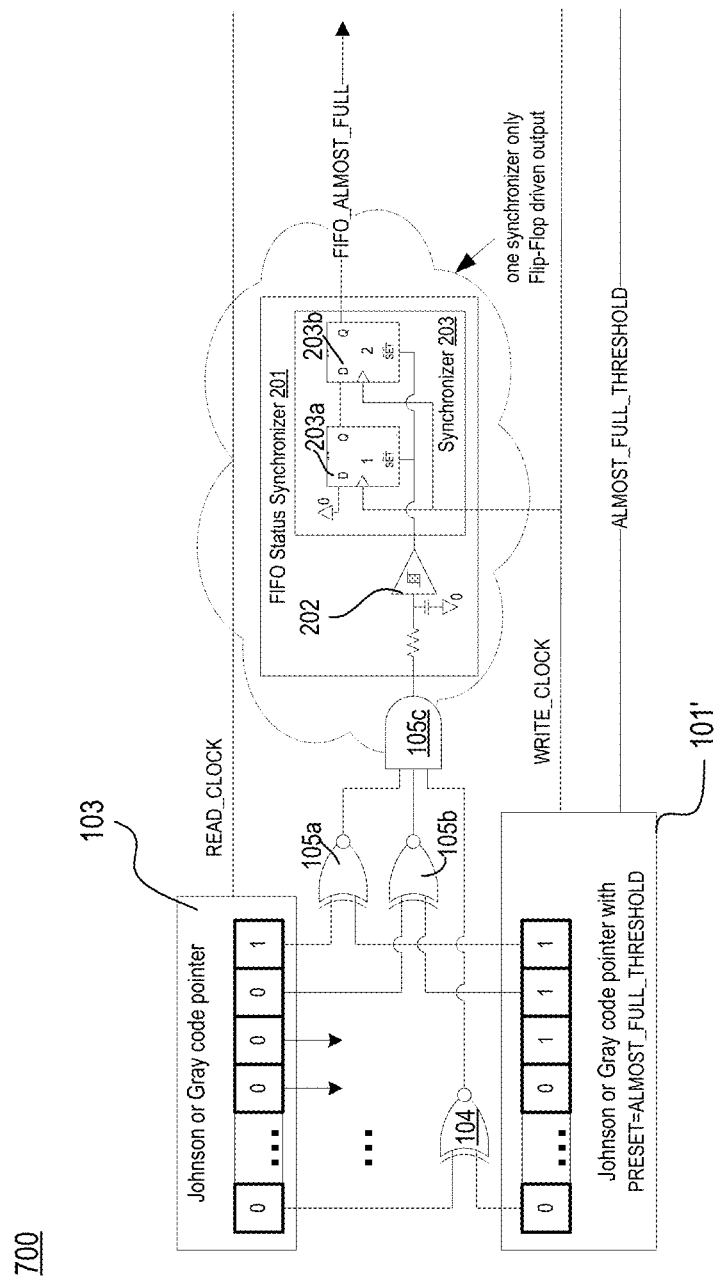
FIG. 7 illustrates an apparatus for FIFO almost full status generation, in accordance with some embodiments.

FIG. 7 illustrates apparatus 700 for FIFO almost-full status generation, in accordance with some embodiments. Apparatus 700 for determining whether the FIFO is almost full is similar to the apparatus of FIG. 2A but for an addition of a threshold (e.g., ALMOST_FULL_THRESHOLD). In some embodiments, the threshold presets the Johnson or Gray code pointer 101' (same as Johnson or Gray code pointer 101 but with threshold capability) associating with the write clock. The threshold can be programmable. The threshold allows for setting a guidepost for indicating an almost full FIFO. In some embodiments, value of the write pointer 101 increases by the value of ALMOST_FULL_THRESHOLD, and the result is then presented to comparators 104 through 105 (e.g., XNOR or XOR gates). Thus, the comparators generate FIFO_ALMOST_FULL indication when the free (unwritten) space in the FIFO is equal to ALMOST_FULL_THRESHOLD.

Figure 8:
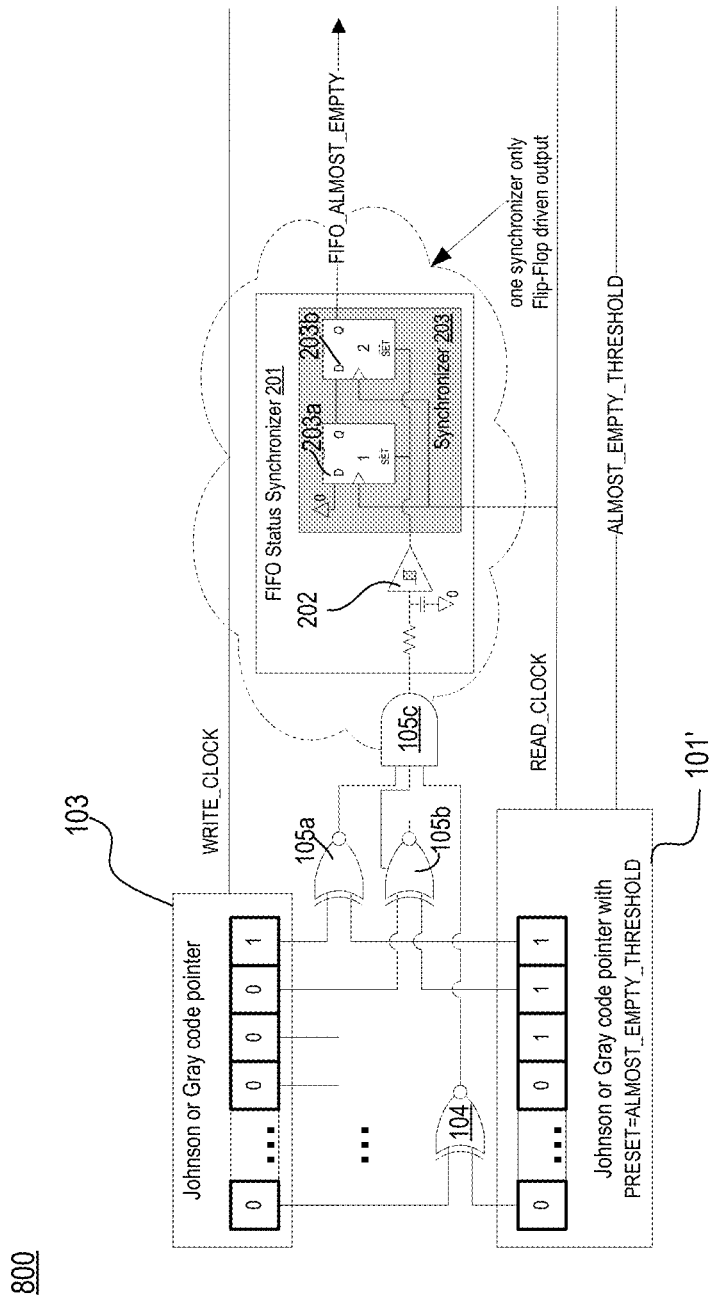
FIG. 8 illustrates an apparatus for FIFO almost empty status generation, in accordance with some embodiments.

FIG. 8 illustrates apparatus 800 for FIFO almost empty status generation, in accordance with some embodiments. The apparatus for determining whether the FIFO is almost empty is similar to the apparatus of FIG. 2B but for an addition of a threshold (e.g., ALMOST_EMPTY_THRESHOLD). In some embodiments, the threshold presets the Johnson or Gray code pointer associating with the read clock (READ_CLOCK). The threshold can be programmable. In some embodiments, value of the read pointer 101 increases by the value of ALMOST_EMPTY_THRESHOLD, and the result is then presented comparators 104 through 105. Thus, the comparators generate FIFO_EMPTY_FULL indication when the filled (unread) space in the FIFO is equal to ALMOST_EMPTY_THRESHOLD.

Figure 9:
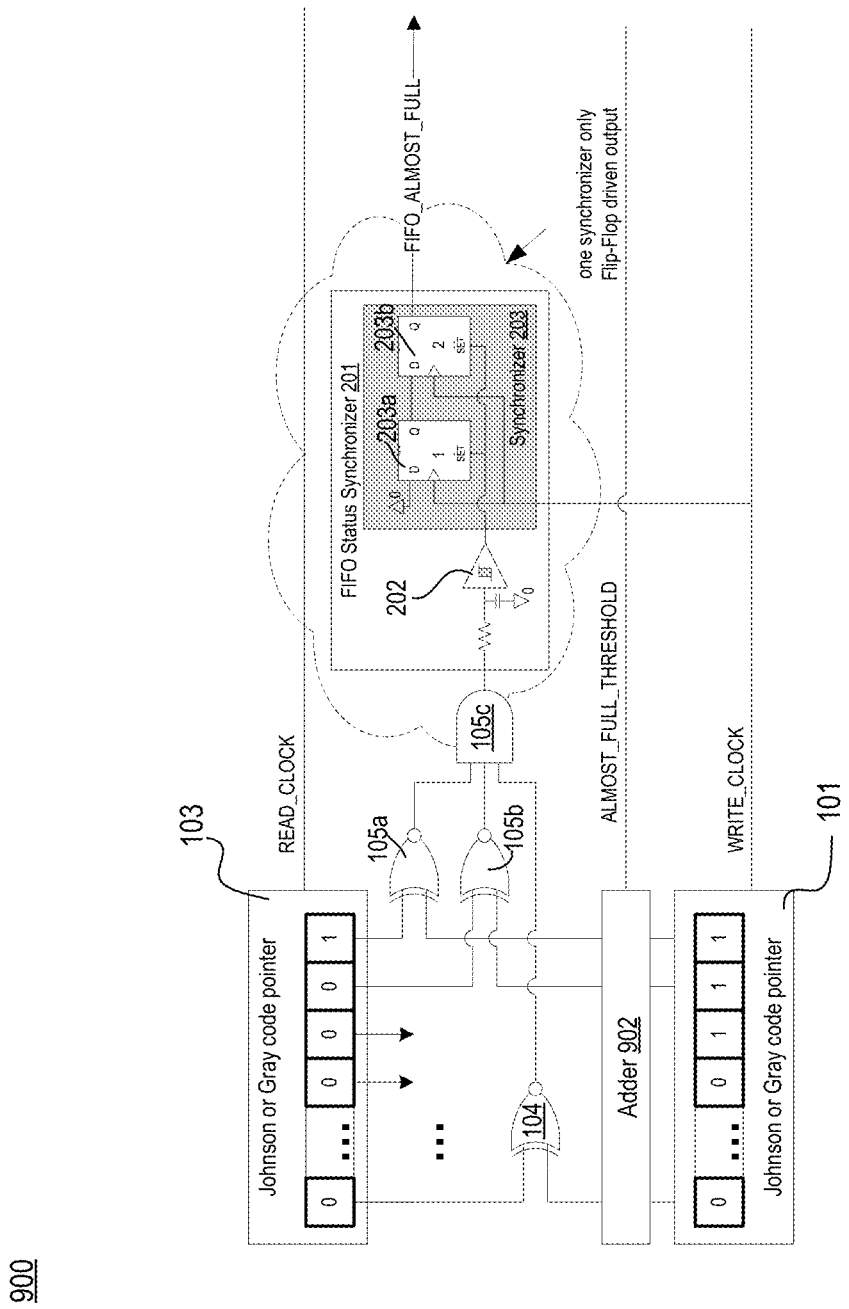
FIG. 9 illustrates an apparatus for FIFO almost full status generation, in accordance with some embodiments.

FIG. 9 illustrates apparatus 900 for FIFO almost full status generation, in accordance with some embodiments. The apparatus for determining whether the FIFO is almost full is similar to the apparatus of FIG. 2A but for an addition of a threshold (e.g., ALMOST_FULL_THRESHOLD). The threshold is added, by adder 902, to the pointer associated with the write clock (WRITE_CLOCK). Any suitable adder can be used for implementing adder 902 of FIG. 9. The threshold can be programmable. In some embodiments, adder 902 takes the value of the write pointer 101, increases it by the value of ALMOST_FULL_THRESHOLD, and presents the result to the comparators 104 through 105. Thus, the comparators generate FIFO full indication when the free (unwritten) space in the FIFO is equal to ALMOST_FULL_THRESHOLD.

Figure 10:
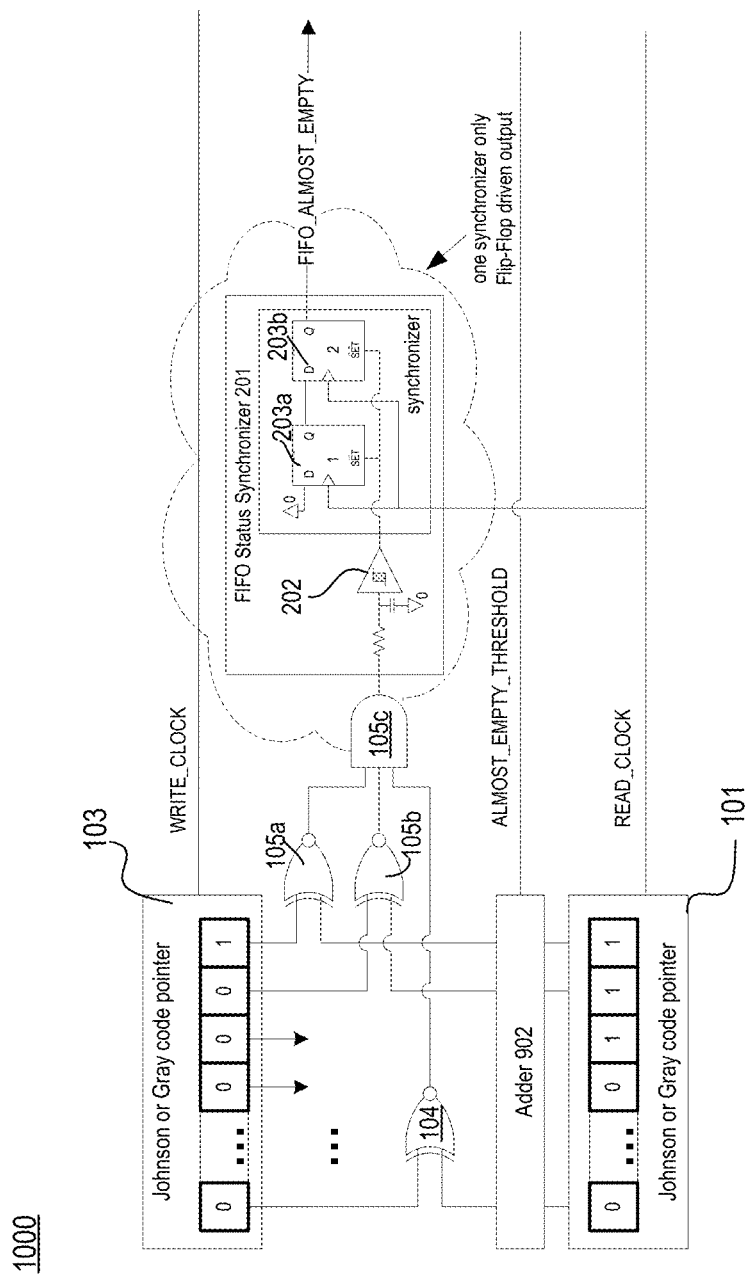
FIG. 10 illustrates an apparatus for FIFO almost empty status generation, in accordance with some embodiments.

FIG. 10 illustrates apparatus 1000 for FIFO almost empty status generation, in accordance with some embodiments. The apparatus for determining whether the FIFO is almost empty is similar to the apparatus of FIG. 2B but for an addition of a threshold (e.g., ALMOST_EMPTY_THRESHOLD). The threshold is added, by adder 902, to the pointer associated with the read clock (READ_CLOCK). Any suitable adder can be used for implementing adder 902 of FIG. 10. The threshold can be programmable. In some embodiments, adder 902 takes the value of the read pointer 101, increases it by the value of ALMOST_EMPTY_THRESHOLD, and presents the result to the comparators 104 through 105. Thus, the comparators generate FIFO empty indication when the filled (unread) space in the FIFO is equal to ALMOST_EMPTY_THRESHOLD.

Figure 11A:
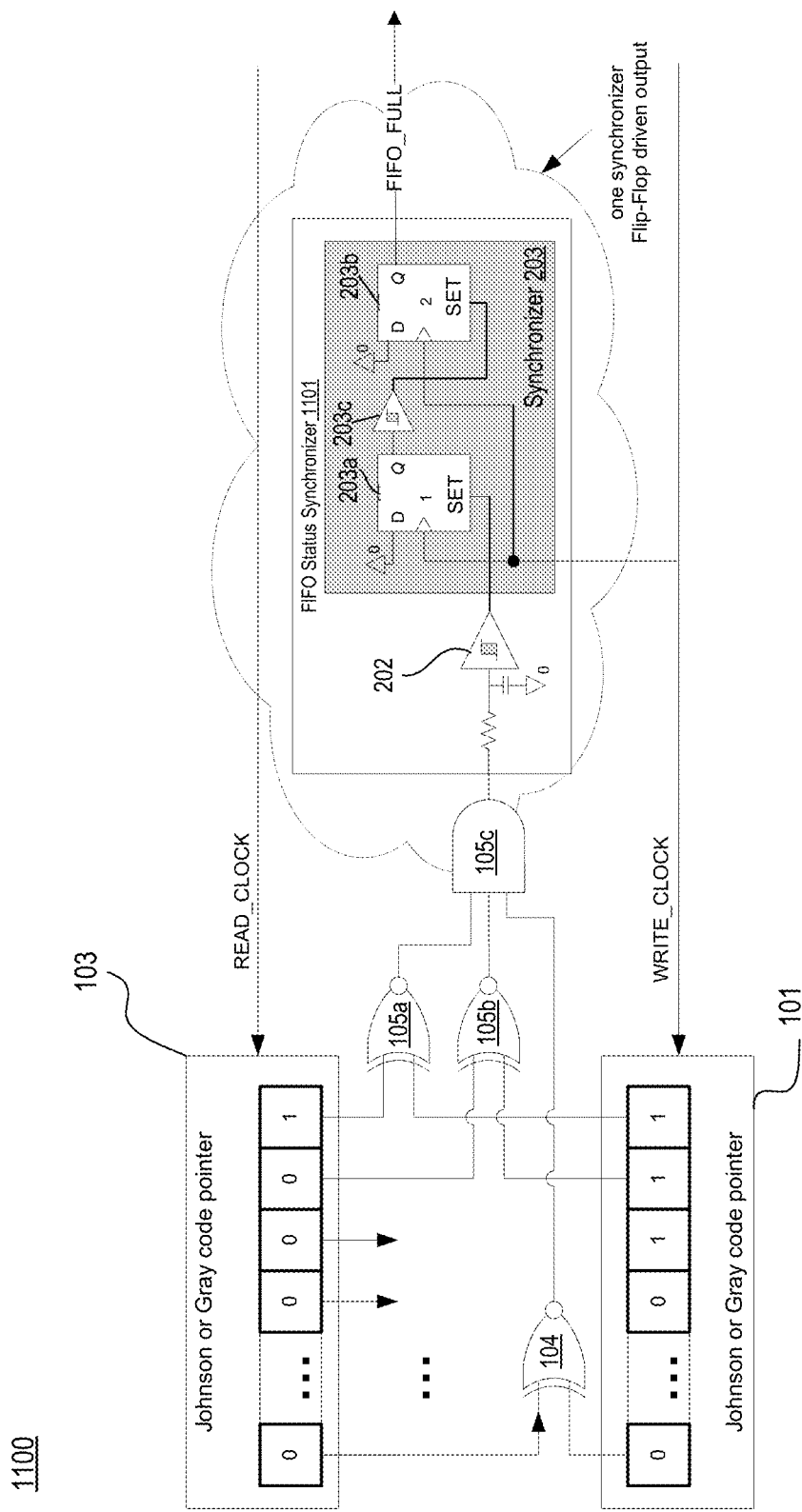
FIG. 11A illustrates an apparatus for FIFO full status generation using two Schmitt-Triggered buffers, in accordance with some embodiments.

FIG. 11A illustrates apparatus 1100 for FIFO full status generation using two Schmitt-Triggered buffers, in accordance with some embodiments. FIFO status synchronizer 1101 comprises two Johnson or Gray code pointers (or registers holding pointers) 101 and 103; comparison logic (e.g., XNOR gates 104, 105a, 105b, etc.); AND gate 105c (to receive outputs of all XNORs), and FIFO status synchronizer 601. FIFO status synchronizer 601 comprises filter, Schmitt Trigger 202c, flip-flops 1 and 2 (203a and 203b, respectively) and Schmitt Trigger 203c coupled as shown. Here, the output of Schmitt Trigger 202 is used to set or reset flip-flop 203a. The data input of flip-flop 203a is tied to a constant value (e.g., ground or 0 V) while the output of flip-flop 601a is received as input of Schmitt Trigger 202c. The output of Schmitt Trigger 203c is used to set or reset flip-flop 203b. To determine whether the FIFO is full, flip-flops 601a and 601b are clocked by the WRITE_CLOCK.

Figure 11B:
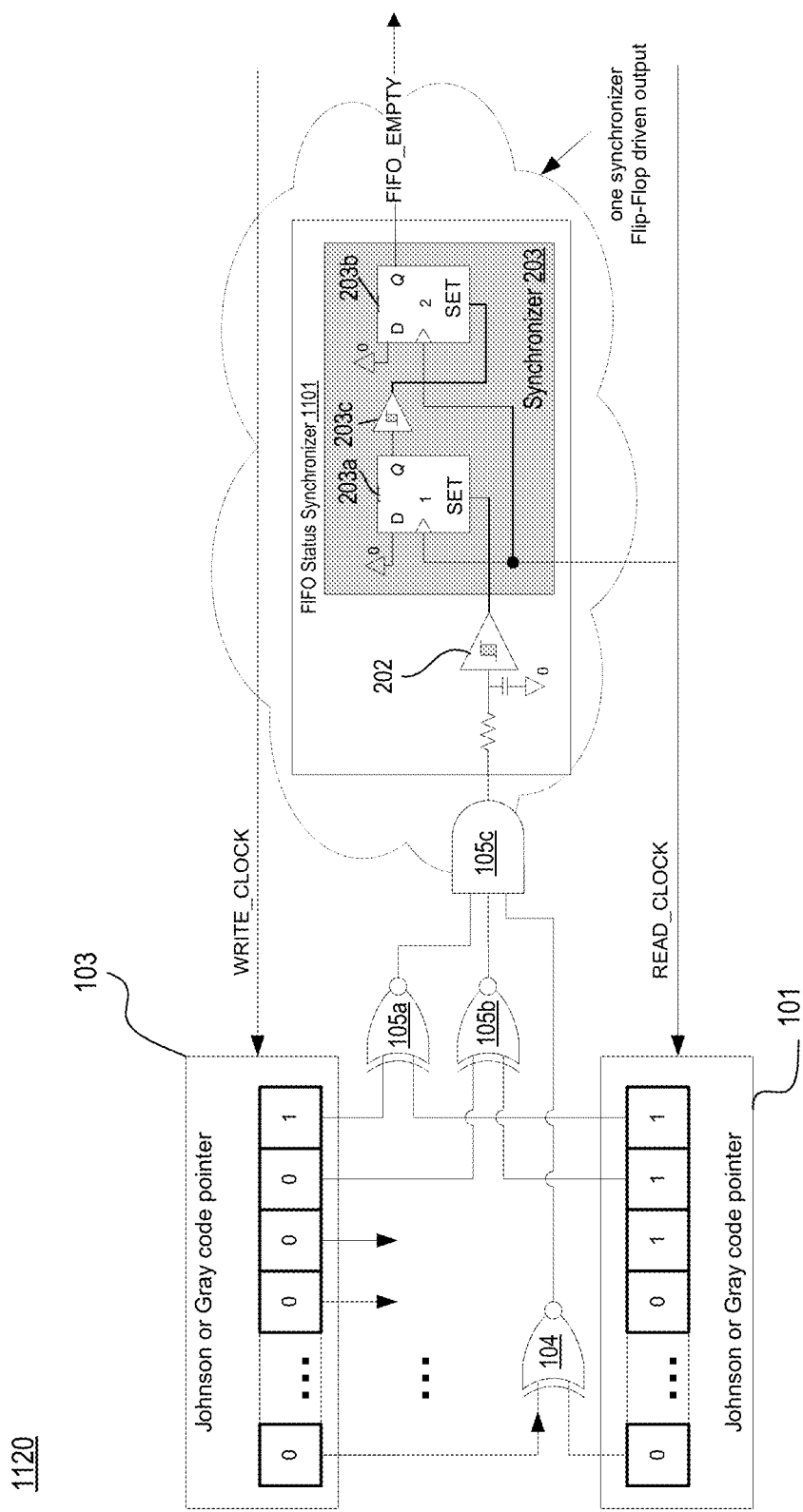
FIG. 11B illustrates an apparatus for FIFO empty status generation using two Schmitt-Triggered buffers, in accordance with some embodiments.

FIG. 11B illustrates apparatus 1120 for FIFO empty status generation using two Schmitt-Triggered buffers, in accordance with some embodiments. Compared to FIG. 11A, here the read clock (READ_CLOCK) is used to sample FIFO flip-flops 203a and 203b. As such, the output (FIFO_EMPTY) of the FIFO status synchronizer 1101 indicates whether the FIFO is empty.

Table 1 illustrates a comparison of various embodiments

TABLE 1

| | PVT (process, voltage, temperature) Slow | | | PVT Fast | | |
|---|---|---|---|---|---|---|
| Design | Transition time baseline | Maximum transition time in metastability range | % Transition time increase | Transition time baseline | Maximum transition time in metastability range | % Transition time increase |
| FIG. 2A w/ Schmitt trigger 202 removed | t | 43 t, non-monotonic transition | 4236% | T | 6.8T, non-monotonic | 5854% |
| FIG. 2A | t | 2.7 t, non-monotonic transition | 175% | T | 4.3T, non-monotonic | 333% |
| FIG. 6A | 2.9t | 2.9 t, monotonic transition | 4% | 3.3T | 3.3T, monotonic | 0.6% |
| FIG. 11A | 2.9t | 2.9 t, monotonic transition | 3% | 3.3T | 3.3T, monotonic | 0.6% |

Here, the transition times are calculated from 10% to 90% of Vcc. % increase refers to the increase in transition time when Schmitt trigger 203c between the two flip-flops 203a and 203b of synchronizer 203 in the designs of FIG. 6A and FIG. 11A reduces the impact of metastability in the event a glitch on the set pin is released at the point the output latch of flip-flop 203a is near its metastable value. For example, the first row in Table 1 shows that in a design without Schmitt triggers 202 or 203c present, in the slow PVT corner, the output transition time of flip-flop 203a increases from a baseline of tin a scenario without metastability to approximately 43 t when metastability is introduced by the glitch disappearing at an inopportune time. In contrast, by adding Schmitt trigger 203c as in FIG. 6A or 11A, the output transition time of 203c marginally increased by no more than 4% when comparing a scenario with worst-case metastability in the output latch of flip-flop 203a to a scenario of no metastability. Moreover, in all simulations done, the voltage waveform in the metastable region transformed from non-monotonic (wiggling up and down before settling on a value) at the input of the Schmitt trigger 203c to a clean, monotonic transition at the output of Schmitt trigger 203c. Adding Schmitt trigger 202 on the SET pin as well, such as in FIG. 11A, reduces the number of scenarios that the glitch will be strong enough to send the output of flip-flop 203a into metastability in the first place and hence provides further protection.

Figure 12:
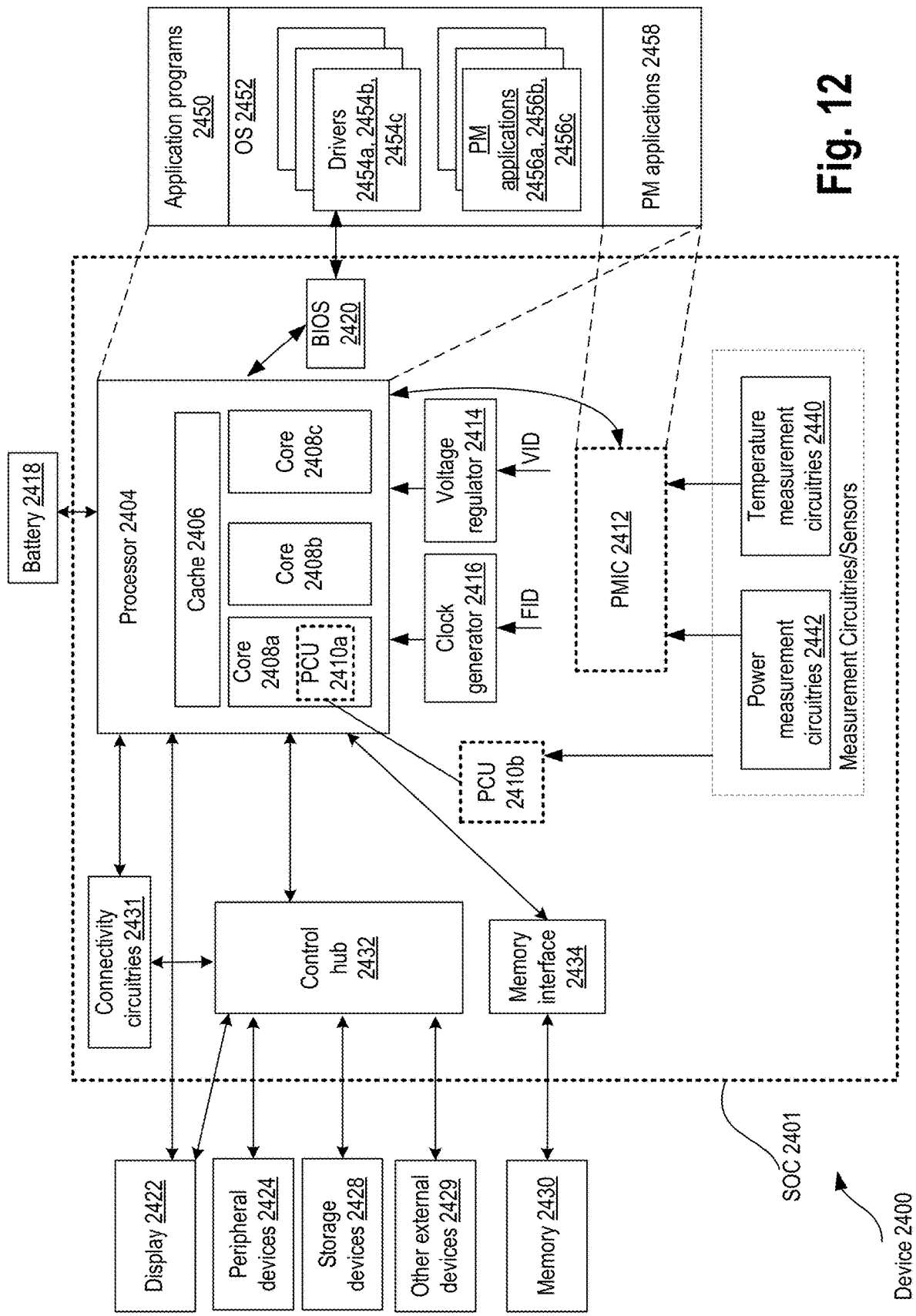
FIG. 12 illustrates a smart device or a computer system or a SoC (System-on-Chip) with clock-crossing FIFO status converged synchronizer, in accordance with some embodiments.

FIG. 12 illustrates a smart device or a computer system or a SoC (System-on-Chip) with apparatus for FIFO status generation, in accordance with some embodiments. Any block (hardware or software) in or associated with SoC 2401 can include the apparatus for FIFO status generation, in accordance with some embodiments.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises an SoC (System-on-Chip) 2401. An example boundary of the SoC 2401 is illustrated using dotted lines in FIG. 12, with some example components being illustrated to be included within SoC 2401—however, SoC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 12, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random-access memory (DRAM) device, a static random-access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430)

may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SoC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SoC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

In some embodiments, battery 2418 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 2410*a/b* has a capability to enable extra compute and telemetries resources for the runtime support of the pCode. Here pCode refers to a firmware executed by PCU 2410*a/b* to manage performance of the 2401. For example, pCode may set frequencies and appropriate voltages for the processor. Part of the pCode are accessible via OS 2452. In various embodiments, mechanisms and methods are provided that dynamically change an Energy Performance Preference (EPP) value based on workloads, user behavior, and/or system conditions. There may be a well-defined interface between OS 2452 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 2452 by including machine-learning support as part of OS 2452 and either tuning the EPP value that the OS hints to the hardware (e.g., various components of SCO 2401) by machine-learning prediction, or by delivering the machine-learning prediction to the pCode in a manner similar to that done by a Dynamic Tuning Technology (DTT) driver. In this model, OS 2452 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 2452 and the other from software such as DTT, and may selectively choose to provide higher performance and/or responsiveness. As part of this method, the pCode may enable in the DTT an option to tune its reaction for the DTT for different types of activity.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1

An apparatus comprising: a pipeline; a first set of pointers associated with the pipeline, wherein the first set of pointers are associated with a read clock used to read from the pipeline; a second set of pointers associated with the pipeline, wherein the second set of pointers are associated with a write clock used to write to the pipeline; comparators to compare the first set of pointers with the second set of pointers; a logic coupled to outputs of the comparators, wherein the logic is to perform an AND operation; a filter coupled to an output of the logic; a Schmitt trigger coupled to the filter; and at least two flip-flops coupled to the Schmitt trigger, wherein an output of one of the at least two flip-flops indicate a status of the pipeline.

Example 2

The apparatus of example 1, wherein the comparators comprises logic gates to perform an exclusive-OR or exclusive-NOR operation.

Example 3

The apparatus of example 1, wherein an output of the Schmitt trigger is to set or reset outputs of the at least two flip-flops.

Example 4

The apparatus of example 1, wherein clock terminals of the at least two flip-flops is coupled to the read clock to indicate an empty status of the pipeline.

Example 5

The apparatus of example 1, wherein clock terminals of the at least two flip-flops is coupled to the write clock to indicate a full status of the pipeline.

Example 6

The apparatus of example 1, wherein the first and second set of pointers are Johnson coded pointers.

Example 7

The apparatus of example 1, wherein the first and second set of pointers are Gray coded pointers.

Example 8

The apparatus of example 1, wherein an input of the first flip-flop of the at least two flip-flops is coupled to ground or power supply, and wherein an output of the first flip-flop of the at least two flip-flops is coupled to an input of the second flip-flop of the at least two flip-flops.

Example 9

An apparatus comprising: a pipeline; comparators to compare a first set of pointers with a second set of pointers, wherein the first set of pointers are associated with the pipeline to read from the pipeline, wherein the second set of points are associated with the pipeline to write to the pipeline; a logic coupled to outputs of the comparators, wherein the logic is to perform an AND operation on the outputs; and a pipeline status synchronizer coupled to the logic, wherein the pipeline status synchronizer is to provide an indicator of whether the pipeline is full, empty, almost full, or almost empty.

Example 10

The apparatus of example 9, wherein the FIFO status synchronizer comprises a Schmitt trigger coupled between two flip-flops, wherein an output of one of the two flip-flops indicates a status of the pipeline, wherein one of the two flip-flops is controlled by an output of the logic.

Example 11

The apparatus of example 10, wherein the first set of pointers are associated with a read clock used to read from the pipeline, and wherein the second set of pointers are associated with a write clock used to write to the pipeline.

Example 12

The apparatus of example 11, wherein clock terminals of the two flip-flops is coupled to the read clock to indicate an empty status of the pipeline.

Example 13

The apparatus of example 11, wherein clock terminals of the two flip-flops is coupled to the write clock to indicate a full status of the pipeline.

Example 14

The apparatus of example 10, wherein an input of a first flip-flip of two flip-flops is coupled to ground or power supply, wherein an output of the first flip-flop of the two flip-flops is coupled to an input of the Schmitt trigger, and wherein an output of the Schmitt trigger is to set or reset a second flip-flop of the two flip-flops.

Example 15

The apparatus of example 9, wherein the comparators comprises XNOR logic gates.

Example 16

The apparatus of example 9, wherein the first and second set of pointers are Johnson coded pointers, or wherein the first and second set of pointers are Gray coded pointers.

Example 17

A system comprising: a memory; a processor coupled to the memory; and a wireless interface to allow the processor to communicate with another device, wherein the processor includes: a first-in-first-out (FIFO); a first set of pointers associated with the FIFO, wherein the first set of pointers are associated with a read clock used to read from the FIFO; a second set of pointers associated with the FIFO, wherein the second set of pointers are associated with a write clock used to write to the FIFO; comparators to compare the first set of pointers with the second set of pointers; a logic coupled to outputs of the comparators, wherein the logic is to perform an AND operation; a filter coupled to an output of the logic; a Schmitt trigger coupled to the filter; and two flip-flops coupled to the Schmitt trigger, wherein an output of one of the two flip-flops indicates a status of the FIFO.

Example 18

The system of example 17, wherein an output of the Schmitt trigger is to set or reset outputs of the two flip-flops.

Example 19

The system of example 17, wherein clock terminals of the two flip-flops is coupled to the read clock to indicate an empty status of the FIFO.

Example 20

The system of example 17, wherein clock terminals of the two flip-flops is coupled to the write clock to indicate a full status of the FIFO, wherein the first and second set of pointers are Johnson coded pointers, or wherein the first and second set of pointers are Gray coded pointers.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a pipeline;
   a first set of pointers associated with the pipeline, wherein the first set of pointers are associated with a read clock used to read from the pipeline;
   a second set of pointers associated with the pipeline, wherein the second set of pointers are associated with a write clock used to write to the pipeline;
   comparators to compare the first set of pointers with the second set of pointers;
   a logic coupled to outputs of the comparators, wherein the logic is to perform an AND operation;
   a filter coupled to an output of the logic;
   a Schmitt trigger coupled to the filter; and
   at least two flip-flops coupled to the Schmitt trigger, wherein an output of one of the at least two flip-flops indicate a status of the pipeline.

2. The apparatus of claim 1, wherein the comparators comprises logic gates to perform an exclusive-OR or exclusive-NOR operation.

3. The apparatus of claim 1, wherein an output of the Schmitt trigger is to set or reset outputs of the at least two flip-flops.

4. The apparatus of claim 1, wherein clock terminals of the at least two flip-flops is coupled to the read clock to indicate an empty status of the pipeline.

5. The apparatus of claim 1, wherein clock terminals of the at least two flip-flops is coupled to the write clock to indicate a full status of the pipeline.

6. The apparatus of claim 1, wherein the first and second set of pointers are Johnson coded pointers.

7. The apparatus of claim 1, wherein the first and second set of pointers are Gray coded pointers.

8. The apparatus of claim 1, wherein an input of the first flip-flop of the at least two flip-flops is coupled to ground or power supply, and wherein an output of the first flip-flop of the at least two flip-flops is coupled to an input of the second flip-flop of the at least two flip-flops.

9. An apparatus comprising:
   a pipeline;
   comparators to compare a first set of pointers with a second set of pointers, wherein the first set of pointers are associated with the pipeline to read from the pipeline, wherein the second set of pointers are associated with the pipeline to write to the pipeline;
   a logic coupled to outputs of the comparators, wherein the logic is to perform an AND operation on the outputs; and
   a pipeline status synchronizer coupled to the logic, wherein the pipeline status synchronizer is to provide an indicator of whether the pipeline is full, empty, almost full, or almost empty.

10. The apparatus of claim 9, wherein the pipeline status synchronizer comprises a Schmitt trigger coupled between two flip-flops, wherein an output of one of the two flip-flops indicates a status of the pipeline, wherein one of the two flip-flops is controlled by an output of the logic.

11. The apparatus of claim 10, wherein the first set of pointers are associated with a read clock used to read from the pipeline, and wherein the second set of pointers are associated with a write clock used to write to the pipeline.

12. The apparatus of claim 11, wherein clock terminals of the two flip-flops is coupled to the read clock to indicate an empty status of the pipeline.

13. The apparatus of claim 11, wherein clock terminals of the two flip-flops is coupled to the write clock to indicate a full status of the pipeline.

14. The apparatus of claim 10, wherein an input of a first flip-flop of two flip-flops is coupled to ground or power supply, wherein an output of the first flip-flop of the two flip-flops is coupled to an input of the Schmitt trigger, and wherein an output of the Schmitt trigger is to set or reset a second flip-flop of the two flip-flops.

15. The apparatus of claim 9, wherein the comparators comprises XNOR logic gates.

16. The apparatus of claim 9, wherein the first and second set of pointers are Johnson coded pointers, or wherein the first and second set of pointers are Gray coded pointers.

17. A system comprising:
a memory;
a processor coupled to the memory; and
a wireless interface to allow the processor to communicate with another device, wherein the processor includes:
  a first-in-first-out (FIFO);
  a first set of pointers associated with the FIFO, wherein the first set of pointers are associated with a read clock used to read from the FIFO;
  a second set of pointers associated with the FIFO, wherein the second set of pointers are associated with a write clock used to write to the FIFO;
  comparators to compare the first set of pointers with the second set of pointers;
  a logic coupled to outputs of the comparators, wherein the logic is to perform an AND operation;
  a filter coupled to an output of the logic;
  a Schmitt trigger coupled to the filter; and
  two flip-flops coupled to the Schmitt trigger, wherein an output of one of the two flip-flops indicates a status of the FIFO.

18. The system of claim 17, wherein an output of the Schmitt trigger is to set or reset outputs of the two flip-flops.

19. The system of claim 17, wherein clock terminals of the two flip-flops is coupled to the read clock to indicate an empty status of the FIFO.

20. The system of claim 17, wherein clock terminals of the two flip-flops is coupled to the write clock to indicate a full status of the FIFO, wherein the first and second set of pointers are Johnson coded pointers, or wherein the first and second set of pointers are Gray coded pointers.

* * * * *